(12) United States Patent
Warren, Jr. et al.

(10) Patent No.: US 7,471,098 B2
(45) Date of Patent: Dec. 30, 2008

(54) TESTING DEVICE AND METHOD FOR AN INTEGRATED CIRCUIT

(75) Inventors: Robert W. Warren, Jr., Loveland, CO (US); Paul J. Huelskamp, Saint Paul, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 427 days.

(21) Appl. No.: 10/975,663

(22) Filed: Oct. 28, 2004

(65) Prior Publication Data

US 2006/0117232 A1    Jun. 1, 2006

(51) Int. Cl.
*G01R 31/02* (2006.01)
(52) U.S. Cl. .................................................. 324/763
(58) Field of Classification Search ............... None
See application file for complete search history.

(56) References Cited

U.S. PATENT DOCUMENTS

| | | | |
|---|---|---|---|
| 5,832,601 A | 11/1998 | Eldridge et al. | |
| 5,897,193 A | 4/1999 | Nishino | |
| 6,028,436 A | 2/2000 | Akram et al. | |
| 6,166,557 A * | 12/2000 | Whetsel | 324/765 |
| 6,175,242 B1 | 1/2001 | Akram et al. | |
| 6,228,684 B1 * | 5/2001 | Maruyama | 438/113 |
| 6,392,430 B1 | 5/2002 | Akram et al. | |
| 6,469,532 B2 | 10/2002 | Akram et al. | |
| 6,894,308 B2 * | 5/2005 | Whetsel et al. | 324/765 |
| 7,183,789 B2 * | 2/2007 | Whetsel | 324/765 |
| 2003/0098457 A1 * | 5/2003 | Whetsel et al. | 257/48 |

* cited by examiner

*Primary Examiner*—Jermele M Hollington
(74) *Attorney, Agent, or Firm*—Fellers, Snider, et al.

(57) ABSTRACT

An apparatus and method are provided for testing integrated circuits. An integrated circuit arrangement is provided having first and second dice. Each die has circuitry for diagnostic testing in response to a diagnostic test signal. The circuitry further defines an input for receiving the diagnostic test signal and an output for transmitting results of the diagnostic testing for each of the dice. Interconnecting circuitry between the dice transmits the diagnostic test signal transmitted to the first die to the second die before the diagnostic testing is completed in the first die.

10 Claims, 11 Drawing Sheets

TESTING DEVICE AND METHOD FOR AN INTEGRATED CIRCUIT

FIELD OF THE INVENTION

The embodiments of the present invention relate generally to the field of integrated circuit testing, and more particularly but without limitation, to an arrangement and associated methodology for simultaneously testing multiple integrated circuits.

BACKGROUND

The proliferation of modern electronic devices has demands spiraling upwardly for integrated circuits ("IC") chips. These demands pertain not just to shipping volumes and lead times, but just as importantly they pertain to the demands for ever more complex design and functionality. Also in play are contrary demands for rigorous cost constraints in the consumer electronics industry.

These demands are being addressed by solutions dealing with both product design and product manufacturing approaches. For example, very large scale integration (VLSI) manufacturing approaches have made some inroads in reducing costs in silicon substrates, and in miniaturizing circuitry while increasing complexity of the IC chips. Heightened attention to process control and continuous process improvement has made inroads in increasing production yields of IC chips from a wafer. Packaging trends have made inroads in combining separate functionalities in a single IC chip, in packaging multiple IC chips in a single multi-chip package, and in stacking IC chips in order to save space and improve connections on printed circuit board assemblies.

In maximizing production yield of IC chips from a wafer, the objective of functional testing for qualifying the chips runs directly contrary to the objective of production throughput. Both of these goals are critical to meeting industry demands for a plentiful supply of quality IC chips.

While various proposed testing methodologies have been found operable, with the continued advancements in IC chip complexity, there remains a continued need for improvements in the manner in which a wafer of IC chips is qualified. It is to such improvements that the claimed invention is generally directed.

SUMMARY OF THE INVENTION

In accordance with preferred embodiments, an apparatus and method are provided for testing integrated circuits.

In some embodiments an integrated circuit is provided having first and second dice. Each die has circuitry for diagnostic testing in response to a diagnostic test signal. The circuitry further defines an input for receiving the diagnostic test signal and an output for transmitting results of the diagnostic testing for each of the dice. Interconnecting circuitry between the dice transmits the diagnostic test signal transmitted to the first die to the second die before the diagnostic testing is completed in the first die.

Other embodiments provide a method for testing an integrated circuit. The method includes steps of: providing the first die and the second die; transmitting the diagnostic test signal to the first die; and subsequently transmitting the diagnostic test signal to the second die while simultaneously performing the diagnostic testing of the first die.

Other embodiments provide an arrangement for testing the integrated circuit comprising the plurality of dice, and means for testing the plurality of dice by transmitting the diagnostic test signal for performing the diagnostic test on the first die of the plurality of dice and transmitting the diagnostic test signal to the second die of the plurality of dice before the diagnostic test on the first die is completed.

These and various other features and advantages which characterize the claimed invention will become apparent upon reading the following detailed description and upon reviewing the associated drawings.

DETAILED DESCRIPTION

Figure 1:
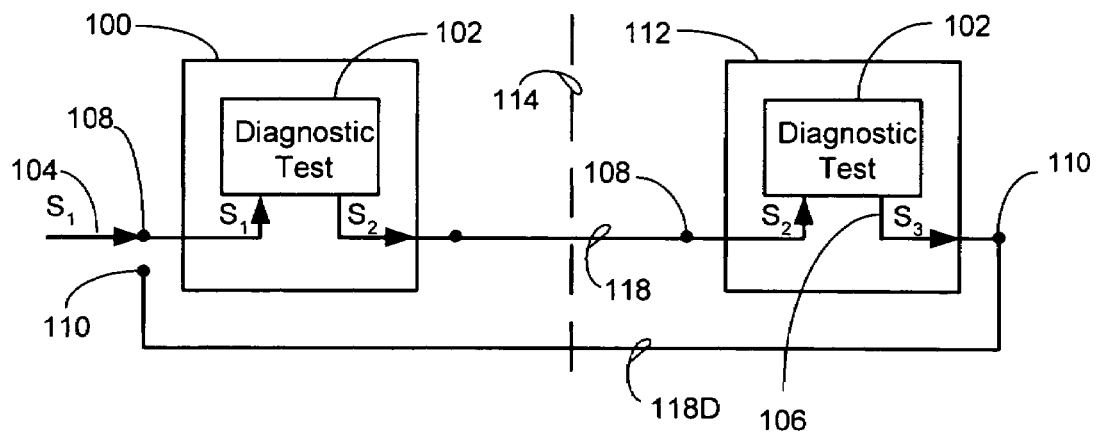
FIG. 1 is a diagrammatic representation of an arrangement of two or more integrated circuits for testing in accordance with embodiments of the present invention.

Referring to the drawings in general, and more particularly to FIG. 1, shown therein is a diagrammatic representation of a die 100 and another die 112, or pair of dice 100, 112, of the type that would be formed within a plurality of dice on a wafer substrate, such as a silicon substrate, for manufacturing purposes. For designation purposes, the die 100 is an integrated circuit that, after slicing and dicing the wafer, defines a single integrated circuit chip. "Dice" is a term commonly associated with the plural form of die 100.

The manner in which the die 100 itself is formed is within the knowledge of a skilled artisan, and as such a detailed discussion of such is not necessary for an understanding of the embodiments of the present invention. The arrangement in which the die 100 is electrically interconnected with other dice, such as dice 112, on a wafer and the manner of testing such arranged dice for improved testing throughput is contemplated by the present embodiments.

The die 100 generally has a complex electronic circuitry that transmits desired output signals in response to particular input signals. It is advantageous to test all or a part of the logical functionality of this circuitry during wafer manufacturing, so as to screen defective dice from downstream manufacturing operations. Accordingly, the die 100 is formed to comprise a diagnostic test sequence 102 that is responsive to a diagnostic test signal 104 for qualifying the logic circuitry functionality of the die 100. The diagnostic test signal 104 includes a known electrical pattern which in some embodiments is coordinated with a timing sequence. The diagnostic test sequence 102 is responsive to the diagnostic test signal 104 ("S1") in transmitting a results signal ("S2") indicative of the results of the diagnostic testing 102.

A testing probe (not shown) can be used to test the die 100 by matingly engaging an input node 108 of die 100 and an output node 110 of die 112. The input node 108 and output node 110 can, for example, be electrically conductive pads on the dice 100, 112. The probe can be used to transmit the diagnostic test signal 104 and receive the results signal 106 after the diagnostic testing sequence 102 of the die 100 and/or die 112 is completed. The probe can be electrically connected to qualifying devices (not shown), such as a host device, for determining and tracking which dice pass the testing. For example, if as a result of the diagnostic test signal 104 the die 112 outputs a results signal 106 associated with a logical "0," this could be predesignated as indicative of a die test failure. A demarcation line 114 indicates where the wafer will subsequently be sliced to provide individual integrated circuit chips from the dice 100, 112. Note that in this arrangement the diagnostic test signal 104 is transmitted to an input node 108 of the first die 100, and that the results of diagnostic testing of both dice 100, 112 can be determined by monitoring the results signal 106 ("S3") at the output 110 of the second die 112. In this arrangement, as a result of the diagnostic test signal S1, the die 100 transmits a results signal S2 to the die 112 over an interconnecting circuit 118. The diagnostic test signal 104 ("S1") initiated at 108 of die 100 is transmitted to 112 from die 100 along the interconnecting circuit 118. The die 112 in turn transmits a results signal 106 (S3). If for example, either of the results signals S2, S3 is associated with a logical "0," then that could be the predesignated indication of at least one of the dice 100, 112 failing test. In another embodiment, the diagnostic test results 106 could be transmitted along circuitry 118D from the output node 110 of die 112 across the demarcation line 114 to close proximity of the input node 108 of die 100 so as to facilitate ease of probing in the event that a long chain of dice would make such a configuration desirable.

Figure 2:
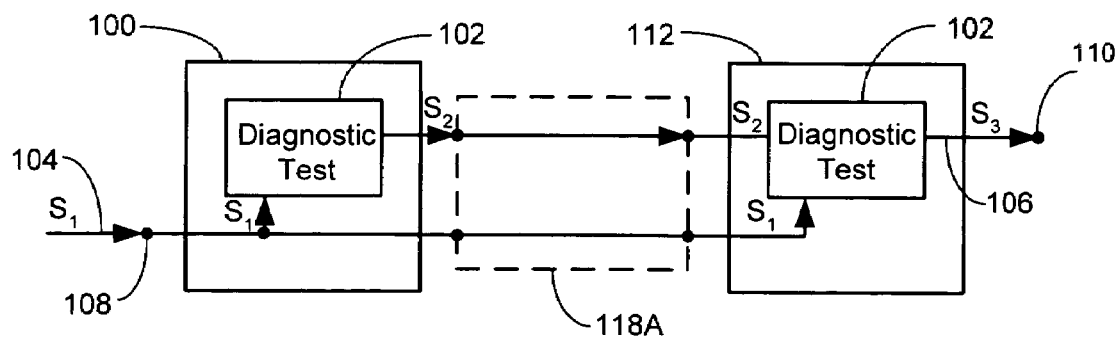
FIG. 2 is a diagrammatic representation of an arrangement of two or more integrated circuits for testing in accordance with other embodiments of the present invention.

FIG. 2 is an arrangement for testing an integrated circuit wherein the interconnecting circuitry 118A is capable of transmitting the diagnostic test signal 104, having been transmitted to the die 100, to the second die 112 before the diagnostic testing is completed in the first die 100. This is advantageous in reducing the cycle time for testing the plurality of dice 100, 112, because the diagnostic test sequences 102 are not executed sequentially. Rather, the diagnostic test sequences 102 can begin substantially simultaneously such that when the results signal S2 from die 100 is transmitted to die 112, the diagnostic test sequence 102 in die 112 is already underway if not already completed.

The clock signal used by the diagnostic test function 102 can be provided in a number of ways in equivalent alternative embodiments. For example, with regard to the illustrative embodiments of FIG. 2, the die 100 can perform the diagnostic test sequence 102 according to a clock signal component of the diagnostic test signal 104, or a clock circuit can be provided within the die 100, or circuitry can provide a clock circuit in the die 112 as controlling. The same holds true for other die, such as die 112, in a chain of dice.

Figure 3:
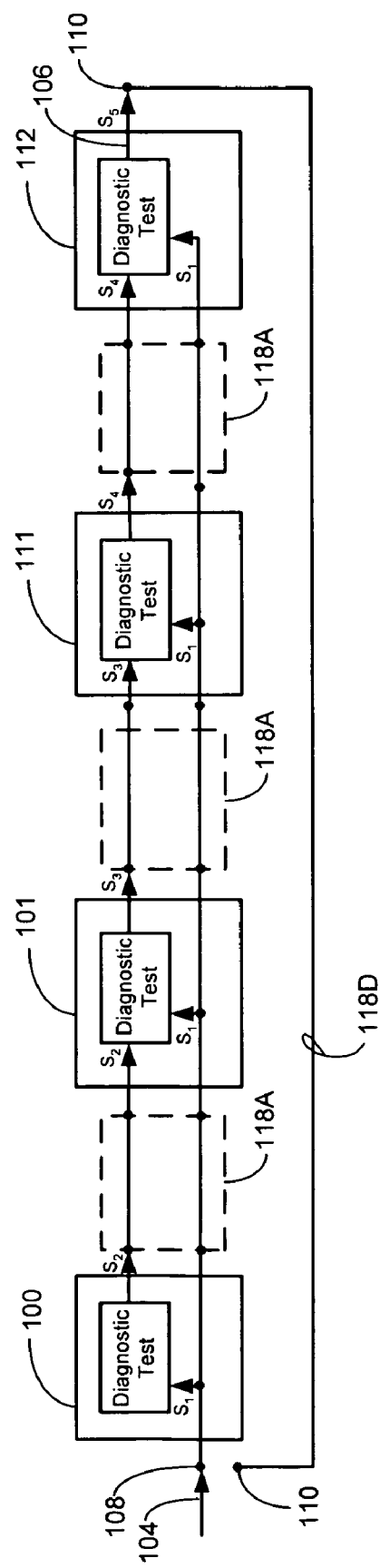
FIG. 3 is a diagrammatic representation of an arrangement of two or more integrated circuits for testing in accordance with other embodiments of the present invention.
Figure 4:
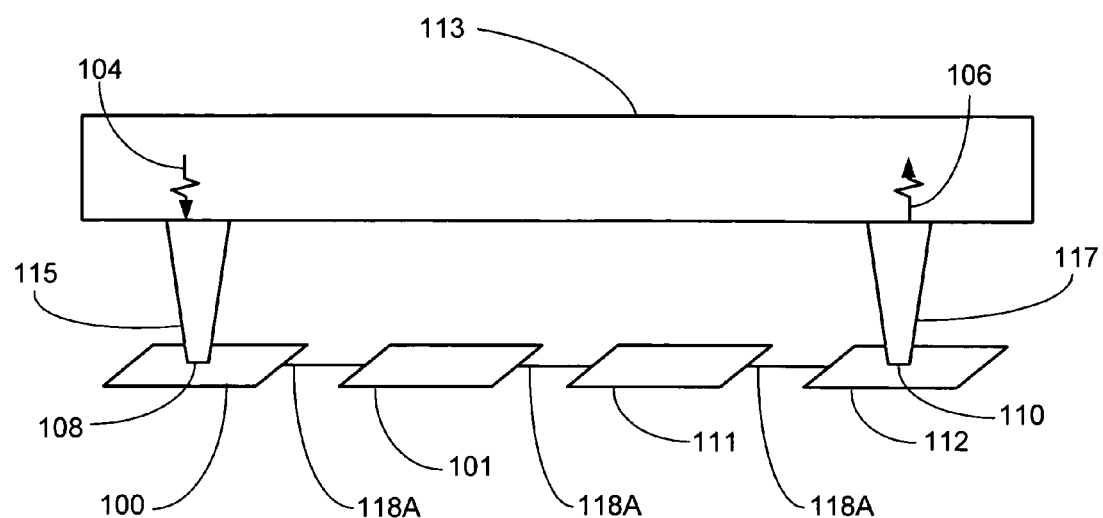
FIG. 4 is a diagrammatic representation of a means for transmitting the diagnostic test signal associated with the arrangement of FIG. 3.

The benefits of the embodiments of the present invention are greater in proportion to the number of dice in a chain of dice being tested. FIG. 3 is a diagrammatic representation similar to FIG. 2 but of a chain of four, rather than two dice. Namely, die 101 and die 111 are disposed between the dice 100, 112. In anembodiment, the diagnostic test results 106 could be transmitted along circuitry 118D from the output node 110 of die 112 across the chain of dice 100, 101, 111, 112 to close proximity of the input node 108 of die 100 so as to facilitate ease of probing. FIG. 4 illustrates how some embodiments employ a probe 113 having a first tip 115 transmitting the diagnostic test signal 104 to the input node 108 of the chain and having a second tip 117 receiving the results signal 106 from the output node 110 of the chain. Note that the interconnecting circuitry 118A in these embodiments is disposed on the substrate wafer.

Figure 6:
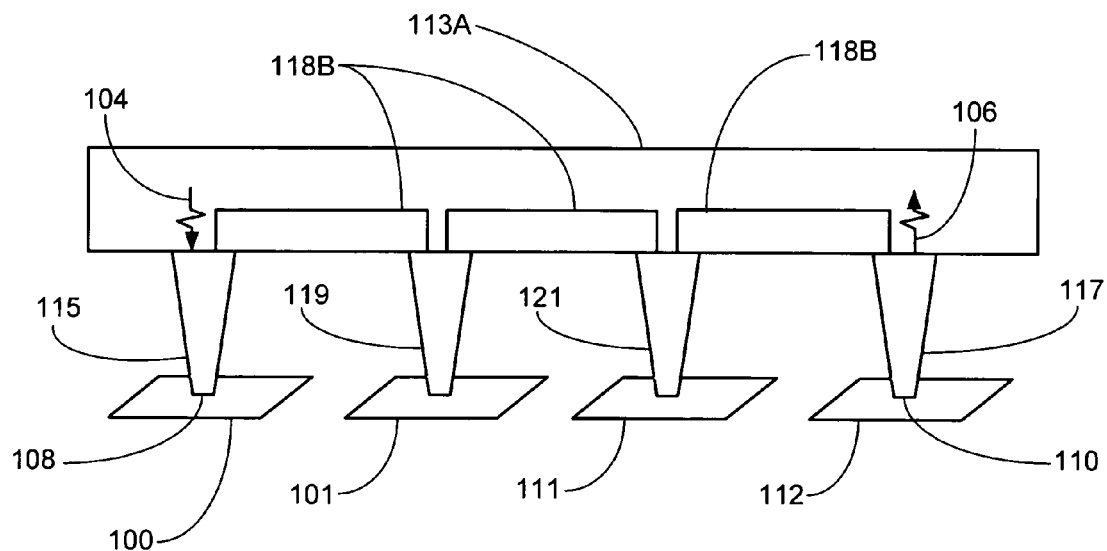
FIG. 6 is a diagrammatic representation of a means for transmitting the diagnostic test signal associated with the arrangement of FIG. 5.
Figure 5:
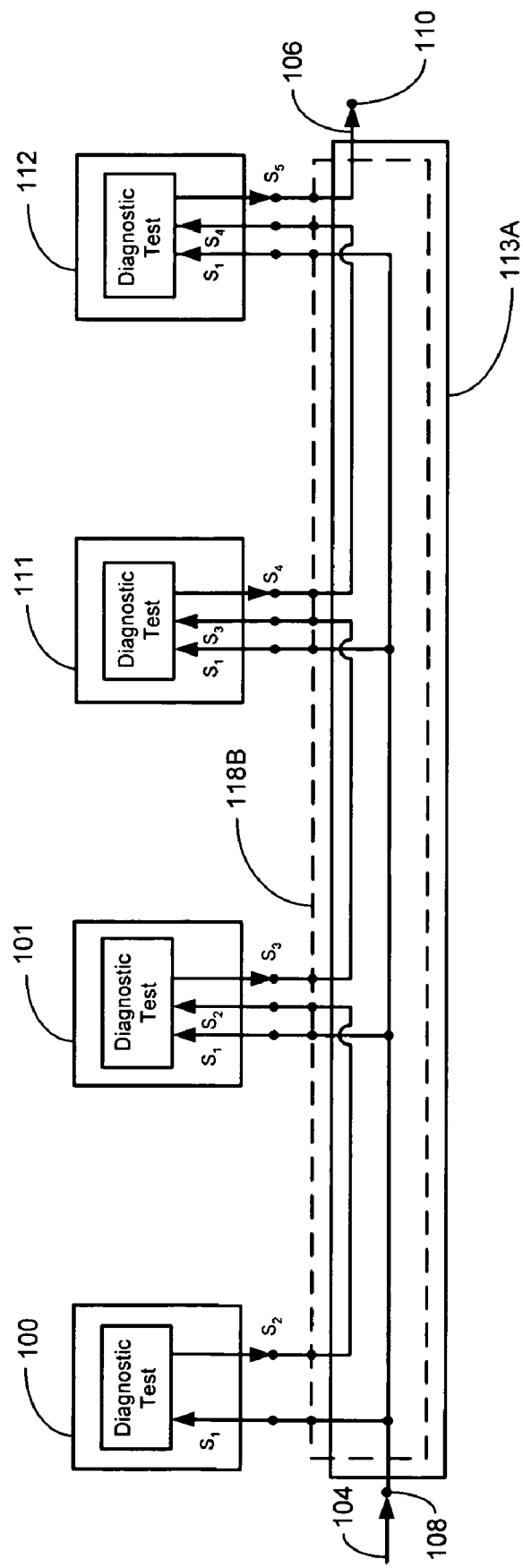
FIG. 5 is a diagrammatic representation of an arrangement of two or more integrated circuits for testing in accordance with other embodiments of the present invention.

In other embodiments some or all of the interconnecting circuitry 118 can be incorporated into the probe 113 rather than the substrate wafer. FIG. 5 is a view similar to FIG. 3 but wherein it is not necessary to embed the interconnecting circuitry 118 within the substrate wafer; rather an interconnecting circuitry 118B is provided within a probe 113A. FIG. 6 is a view of the probe 113A with additional tips 119, 121 for providing the interconnecting circuitry 118B between the dice 100, 101, 111, 112.

Generally speaking, preferably the diagnostic test signal 104 is transmitted to all the dice in a chain before all the respective diagnostic test sequences 102 are completed in the dice. For the illustrative embodiments of FIGS. 3-6, the diagnostic test signal 104 is first transmitted to die 100. Die 100 starts the diagnostic test sequence 102 at time $t_0$. The diagnostic test signal 104 is transmitted by the interconnecting circuitry 118 to die 101 to start the diagnostic test sequence 102 there at time $t_1$. The diagnostic test signal 104 is transmitted by the interconnecting circuitry 118 to die 111 to start the diagnostic test sequence 102 there at time $t_2$. The diagnostic test signal 104 is transmitted by the interconnecting circuitry 118 to die 112 to start the diagnostic test sequence 102 there at time $t_3$. Preferably, the increment time t for transferring the diagnostic test signal 104 is relatively short compared with the time necessary to complete the diagnostic test sequence 102. Thus, embodiments of the present invention contemplate an arrangement and method wherein the diagnostic test signal 104 is transmitted to the last die in a chain of dice before the diagnostic test sequences 102 have been completed in the upstream dice. In some embodiments, such as illustrated in FIG. 5, the diagnostic test signal 104 can be transmitted to all the dice in parallel, such that $t_0=t_3$.

Figure 7:
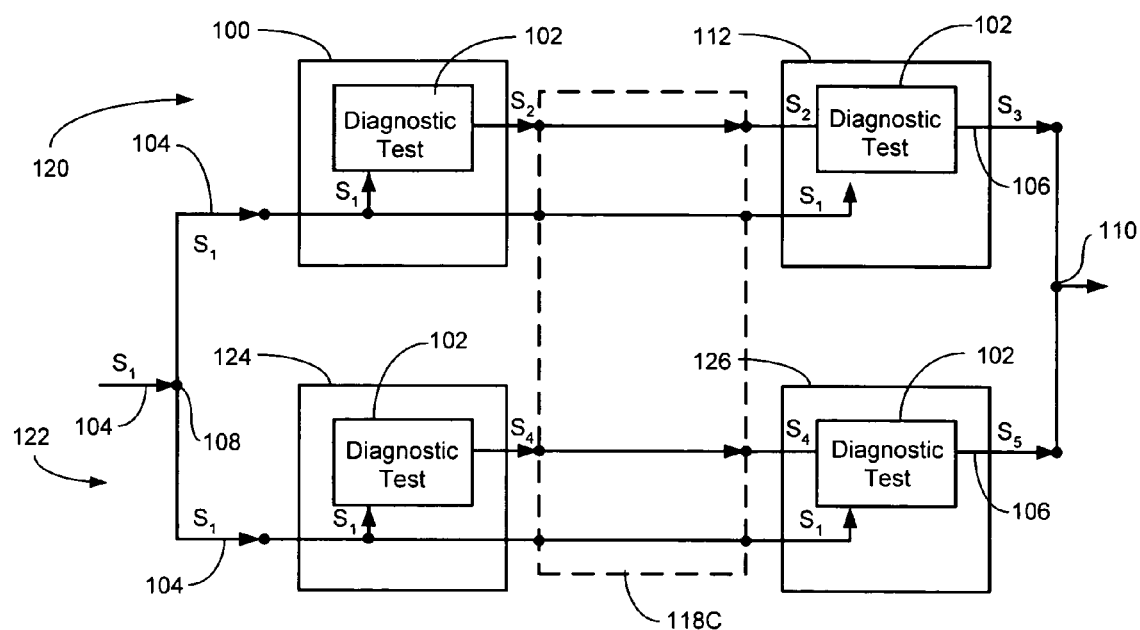
FIG. 7 is a diagrammatic representation of an arrangement of two or more integrated circuits for testing in accordance with other embodiments of the present invention.

The benefits associated with embodiments of the present invention are not only related to the number of dice within the chain being tested, but also to the number of chains being tested. Some embodiments of the present invention contemplate simultaneously testing a plurality of dice chains, wherein the testing proceeds within each chain similarly to that described above. FIG. 7 illustrates a first chain 120 which is the same chain previously described in FIG. 2. A second chain 122 is constructed in like manner, with dice 124, 126 connected together in the same fashion as the dice 100, 112. The interconnecting circuitry 118C ties dice only within the respective chain; that is, in some embodiments the groups 120, 122 can be tested by first transmitting the diagnostic test signal 104 to the input node 108 of group 120, collecting the results signal 106 from the output node 110 of group 120, and then performing the same routine on group 122. However, in other embodiments, as illustrated in FIG. 7, the diagnostic test signal 104 is simultaneously transmitted to a common input node 108 of each chain. Alternatively, the transmitting means can transmit the diagnostic signal 104 to the input node 108 of each group 120, 122 simultaneously. The diagnostic test signal 104 is thus transmitted to enable initiating the diagnostic test sequence 102 on downstream dice 112, 126 before the diagnostic testing 102 is completed on the upstream dice 100, 124, respectively.

Note that the illustrative embodiments of FIG. 7 show the interconnecting circuitry 118C embedded within the substrate wafer, as described above. Alternatively, in some embodiments the interconnecting circuitry 118C can be provided within a probe, as described above.

Figure 8:
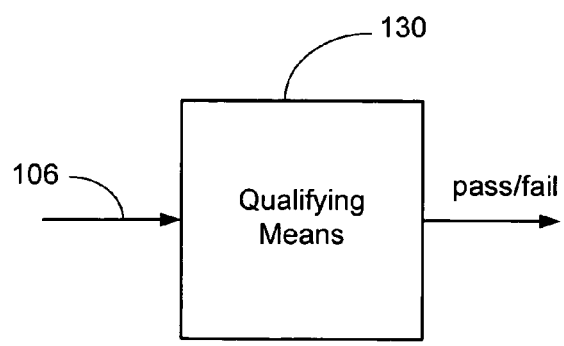
FIGS. 8-10 are diagrammatic representations of qualifying means for the integrated circuits in accordance with embodiments of the present invention.
Figure 9:
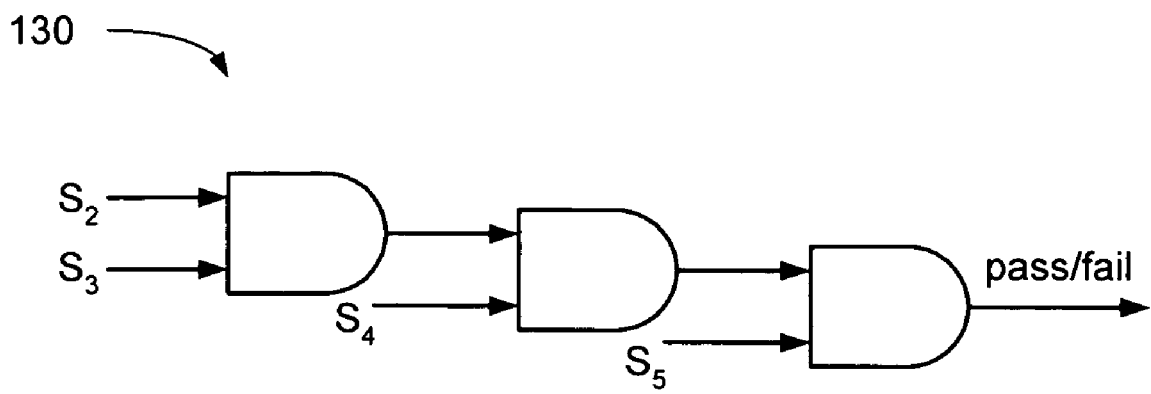
Figure 10:
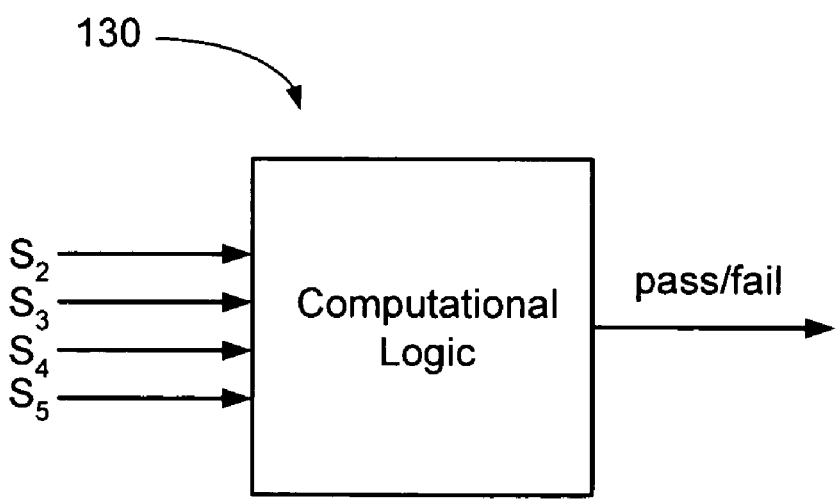

FIG. 8 illustrates embodiments of the present invention further contemplating a qualifying means 130 which makes a pass/fail determination for the dice in response to the results signal 106. The qualifying means 130 can comprise relatively simple logic circuitry, such as the series of AND-GATES illustrated in FIG. 9, providing a pass indication only if all the dice in a chain pass the diagnostic test sequence 102. Alternatively, more complex computational logic circuitry as shown in FIG. 10 can be provided that stores and analyzes individual die testing results, such that failures can be pinpointed within a tested chain. The qualifying means 130 circuitry can be provided either within the substrate wafer, within the probe, or external to both.

Figure 11:
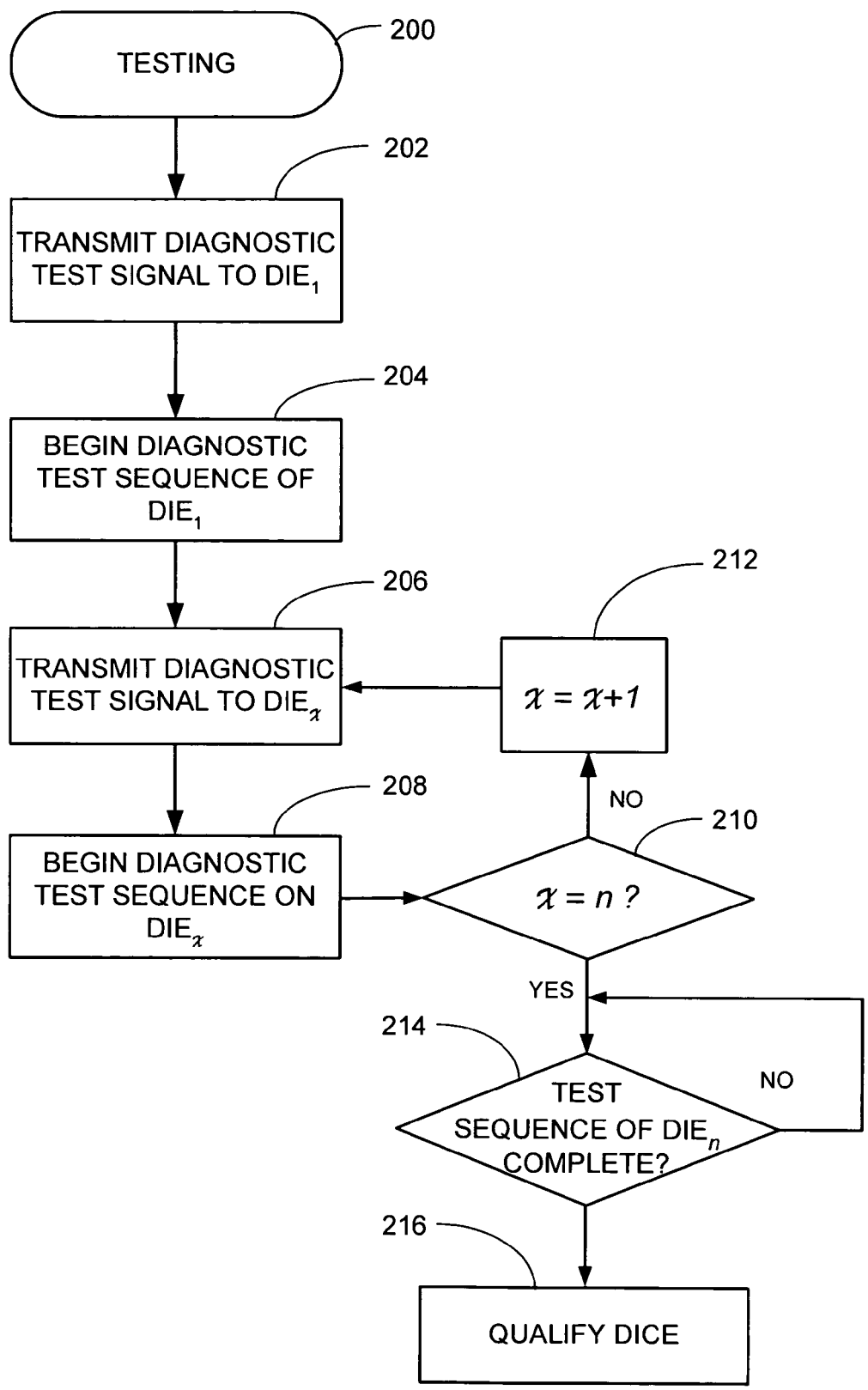
FIG. 11 is a flowchart of steps for practicing a method commensurate with device and method embodiments of the present invention.

FIG. 11 is a flow chart illustrating steps in practicing a method 200 for TESTING an integrated circuit commensurate with embodiments of the present invention. The method 200 begins with providing an integrated circuit with an input node 108 and there transmitting the diagnostic test signal 104 to the first die in the chain of dice at block 202. The diagnostic test sequence 102 of the first die then commences in block 204. In block 206 the diagnostic test signal is transmitted to the next die, die$_x$, in the chain of dice. Preferably, the transmitting step of block 206 occurs before the testing step of block 204 is completed. In block 208 the diagnostic test sequence 102 of die$_x$ begins. Decision block 210 determines whether the number of diagnostic test sequences 102 begun, designated as x, is equal to the number of dice in the chain, designated as n. If no, then control is passed to block 212 where a counter increments the value x, and then the diagnostic test signal 104 is transmitted to the next die$_x$ in the chain of dice in block 206. If the result of decision block 210 is yes, then control passes to decision block 214 where it is determined whether the diagnostic test sequence 102 is completed for all the dice in the chain. If yes, then the dice are qualified in block 216 according to the results signal 106 from the testing.

Figure 12:
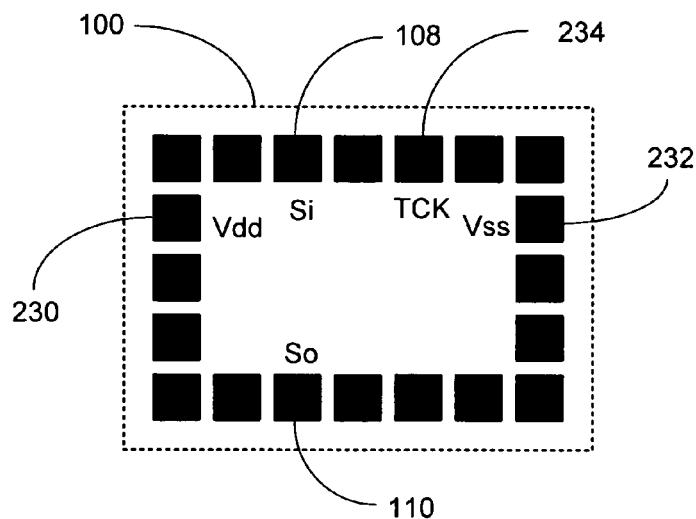
FIG. 12 is a diagrammatic representation of an integrated circuit suited for use with embodiments of the present invention.

Turning now to a somewhat more detailed yet still generalized discussion of the dice architecture in preferred embodiments, FIG. 12 illustrates the die 100 having a supply voltage ("V$_{dd}$") pad 230 and a ground voltage ("V$_{ss}$") pad 232 forming a completed power circuit in the die 100. The input node 108 and the output node 110 are provided by respective pads as well. In these illustrative embodiments, the diagnostic test signal 104 and the results signal 106, transmitted to the input and output nodes 108, 110 respectively, are generally synchronous to a clock ("TCK") 234.

Figure 13:
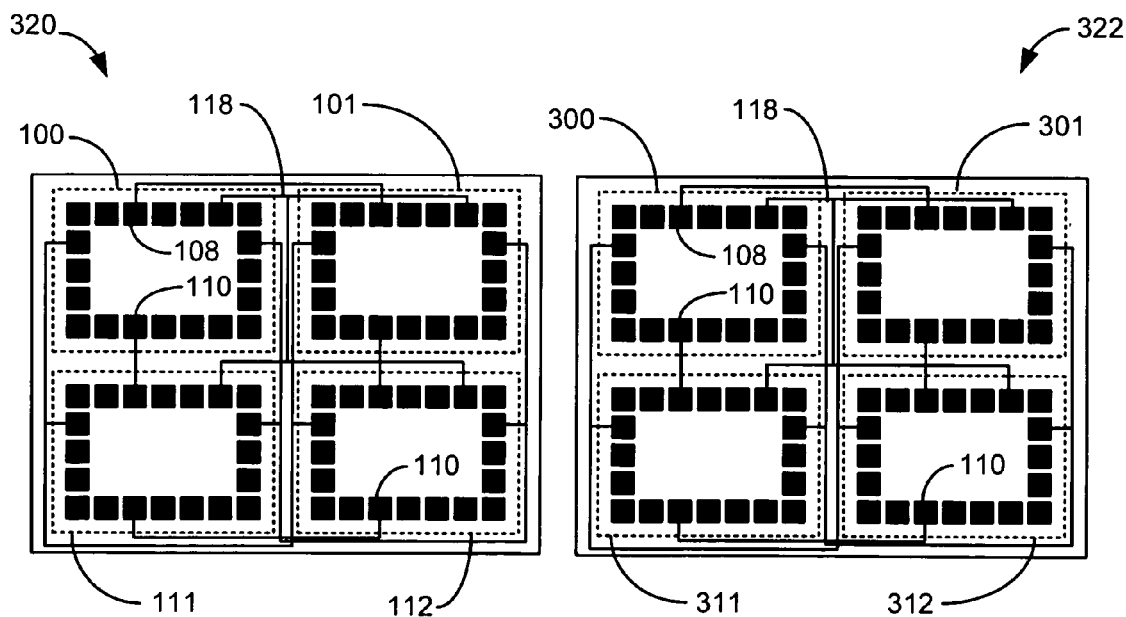
FIG. 13 is a diagrammatic representation of two chains with four circuits in each chain suited for use with embodiments of the present invention.

Similar to the illustrative embodiments of FIG. 7, FIG. 13 illustrates an arrangement comprising two groupings of four dice in each chain. Particularly, the dice 100, 101, 111, and 112 are joined by interconnecting circuitry 118 defining a first grouping, or chain, 320. In like manner dice 300, 301, 311, and 312 are joined by interconnecting circuitry 118 defining a second chain 322. In some embodiments, a probe, such as probe 113 of FIG. 4, would be moved adjacent the first chain 320 and matingly engaged therewith in order to transmit the diagnostic test signal 104 to the input node 108 of die 100, and to receive the results signal 106 from the output node 110 of die 112. The probe 113 could then move adjacent to the chain 322, and repeat the routine by matingly engaging therewith in order to transmit the diagnostic test signal 104 to the input node 108 of die 300, and to receive the results signal 106 from the output node 110 of die 312. In other embodiments, die 100 and die 300 could both transmit the diagnostic test signal 104 to the respective input nodes 108 and receive the results signal 106 all of the dice in the chains 320 and 322 respectively from the respective output nodes 110. Alternatively, in some embodiments the probe 113 could be configured to simultaneously transmit the diagnostic test signal 104 to the input nodes 108 of both dice 100, 300, and to simultaneously receive the results signal 106 from the output nodes 110 of both dice 112, 312. The latter embodiments thus afford testing the two chains 320, 322 simultaneously. The embodiments of the invention contemplate testing one, two, or more than two chains simultaneously.

Figure 14:
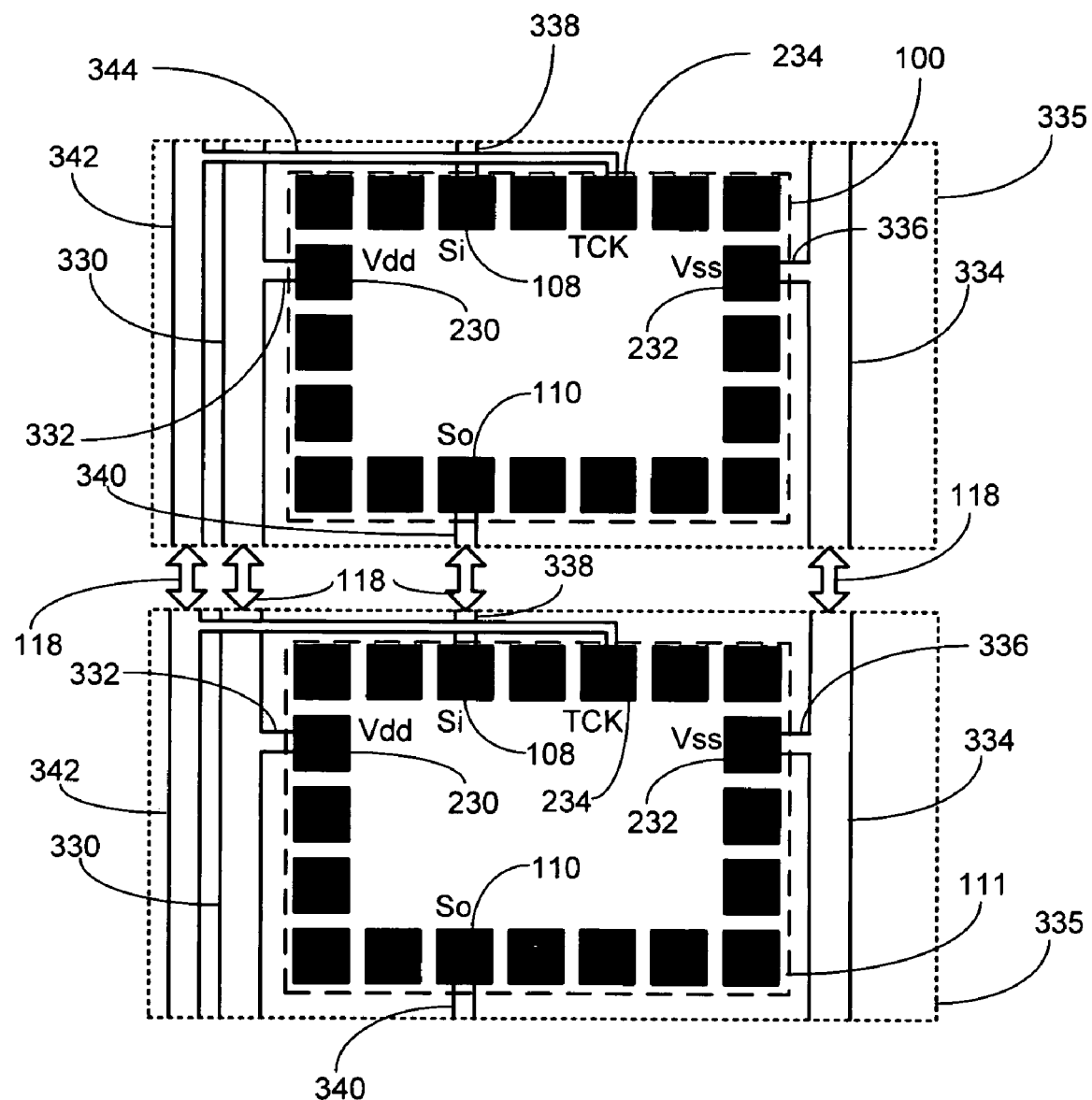
FIG. 14 is a detailed view of a portion of the integrated circuit arrangement of FIG. 13.

FIG. 14 shows more particularly, yet still generally, adjacent dice 100, 111 constructed within a multi-layer circuit in accordance with embodiments of the present invention. The multi-layer circuitry can be, without limitation, provided by deposition techniques such as photo lithography. The V$_{dd}$ pad is connected to a voltage high circuit trace 330 by a lead 332. The V$_{ss}$ pad 232 is connected to a voltage low circuit trace 334 by a lead 336. The input nodes 108 and the output nodes 110 are connected to leads 338, 340, respectively. The timing clock pad 234 is connected to a timing clock trace 342 by a lead 344. In illustrative embodiments, the voltage circuit traces 330, 334 and respective leads 332, 336 can be deposited at one layer in the multi-layer circuitry. The input node lead 338 and the output node lead 340 can be deposited at another layer, and the timing clock lead 344 and trace 342 can be deposited at yet a different level. The interconnecting circuitry 118 is illustrated by a number of graphical representative arrows. This embodiment illustrates a single die mask 335 to connect a string of like dice on a wafer generally used to enhance fabrication processes.

Figure 15:
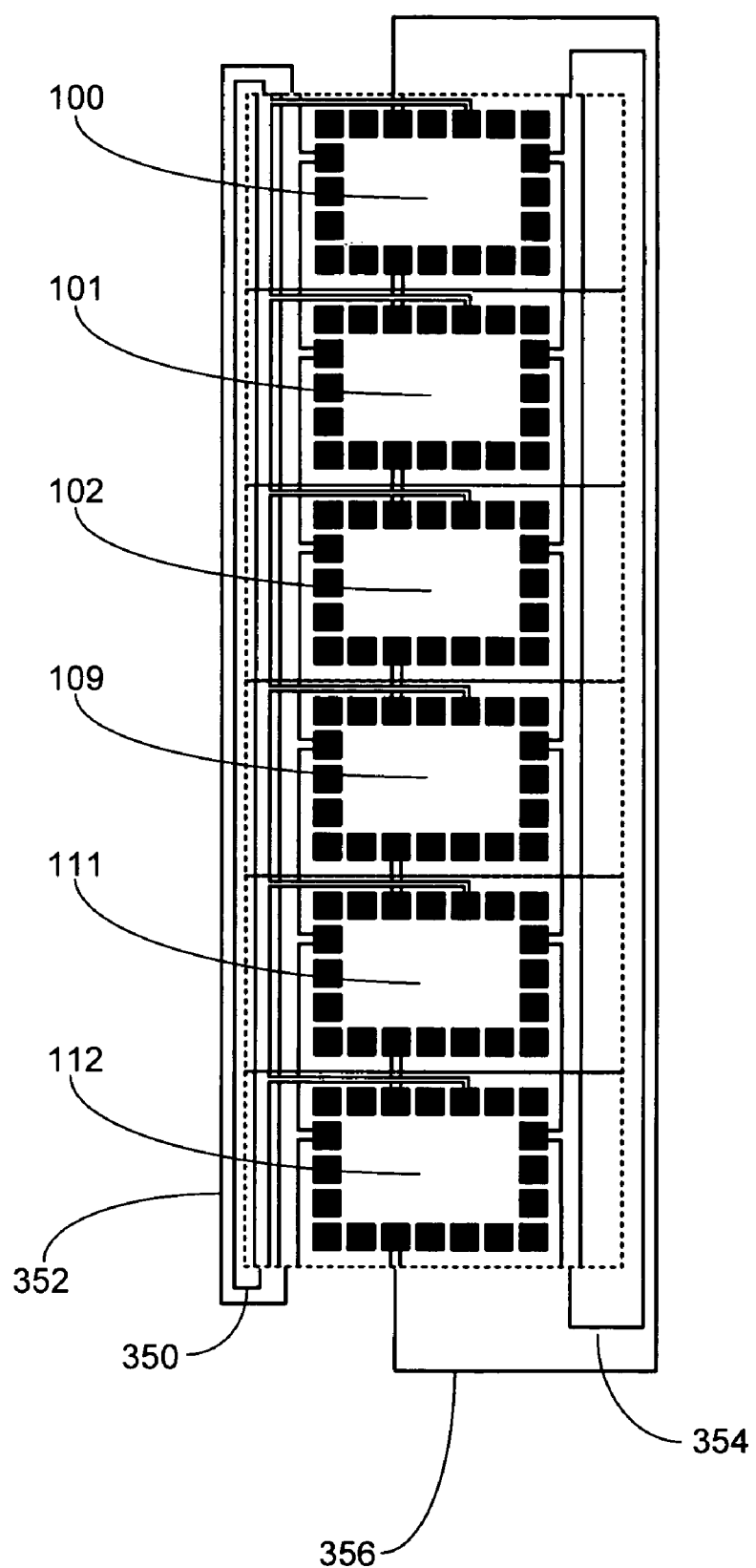
FIG. 15 is a diagrammatic representation of a chain of six integrated circuits arranged with a feedback loop in accordance with embodiments of the present invention.

FIG. 15 illustrates embodiments employing a feedback loop between the first die 100 and the last die 112 in a chain of six dice 100, 101, 102, 109, 111, and 112. The feedback loop construction permits both transmitting the diagnostic test signal 104 and receiving the results signal 106 to/from the die 100. The feedback loop couples the last die 112 and the first die 100 by way of a trace 350 connecting the respective timing clock traces 342; a trace 352 connecting the respective V$_{dd}$ traces 330; a trace 354 connecting the respective V$_{ss}$ traces 334; and a trace 356 connecting the output node 110 (of die 112) to the input node 108 (of die 100).

Figure 16:
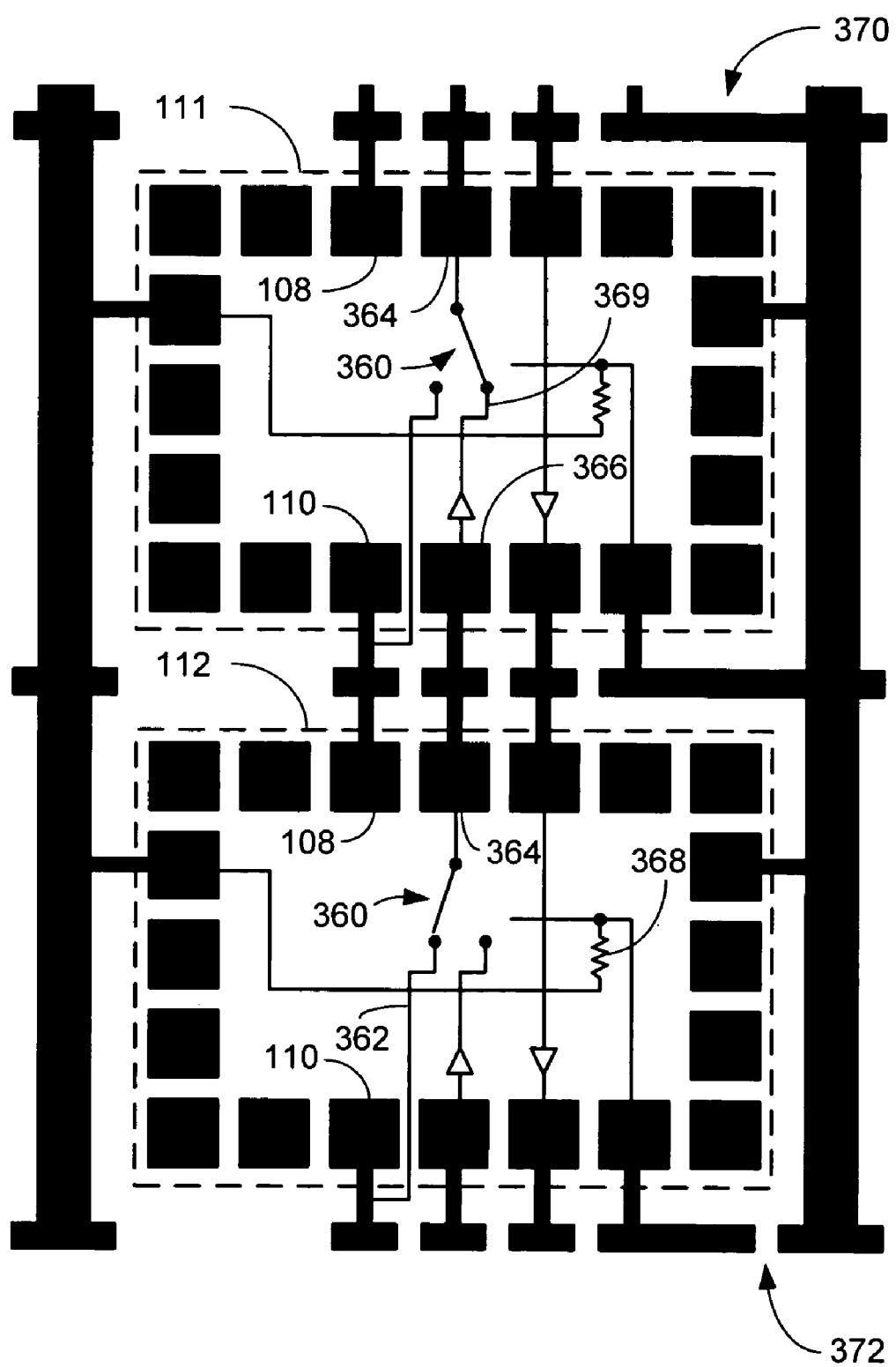
FIG. 16 is an enlarged detail of a portion of FIG. 15.

FIG. 16 illustrates the last two dice 111, 112 of the chain of FIG. 15. As the diagnostic test signal 104 traverses the chain (in upstream dice 100, 101, 102, and 109) it will eventually encounter the input node 108 in die 111. The die 111 operatively transmits the diagnostic test signal 104 from the output node 110 to the input node 108 in die 112. Upon completion of the diagnostic test sequence 102, the results signal 106 is transmitted to the output node 110 in die 112. A switch 360 is in the position shown in die 112 because of an open ground switch circuit 372, operating in conjunction with a pull up resister 368 to activate the switch 360. The results signal 106 is thereby transmitted to line 362 connected to the output node 110, through the switch 360 to a secondary output node 364. The secondary output node 364 of die 112 is connected to a secondary input node 366 of die 111, by a part of the interconnecting circuitry 118. The results signal 106 is thereafter transmitted from the secondary input node 366 to the secondary output node 364 across line 369 and the switch 360 in a second position as shown. The switches 360 of the dice 109, 102, 106, and 100 are also set to the second position of die 111 so that the results signal 106 is transmitted in this same manner back to die 100. This configuration could be a single layer turn around circuit and can comprise overlap regions in the circuitry, such as 370, to compensate for die to die stepper variations inherent in some wafer manufacturing processes when using a single die mask design as disclosed previously.

Summarizing generally, an arrangement is provided for testing an integrated circuit. The integrated circuit has a first die (such as 100) and a second die (such as 112), each comprising circuitry adapted for performing a diagnostic test sequence (such as 102) in response to transmission of a diagnostic test signal (such as 104). The dice circuitry defines an input node (such as 108) for receiving the diagnostic test signal, and an output node (such as 110) for transmitting a results signal (such as 106). Interconnecting circuitry (such as 118) transmits the diagnostic test signal transmitted to the first die to the second die before the diagnostic testing is completed in the first die.

Some embodiments comprise two or more groupings, or chains, of dice that can be tested simultaneously. For example, the arrangement can include a third die (such as 124) and a fourth die (such as 126), each comprising circuitry adapted for diagnostic testing in response to the diagnostic test signal, the circuitry defining an input for receiving the diagnostic test signal and an output for transmitting results of the diagnostic testing for each of the dice. The interconnecting circuitry between the dice transmits a diagnostic test signal transmitted to the third die to the fourth die before the diagnostic testing is completed in the third die. A means for transmitting the diagnostic test signal such as a probe (such as 113) can transmit the diagnostic test signal to the input node of each chain of dice simultaneously.

The dice can be supportingly disposed within a wafer substrate. The interconnecting circuitry can likewise be disposed in the wafer substrate, or can be disposed within the probe. With the interconnecting circuitry provided in the probe, then the probe can matingly engage the first and second dice for transmitting the diagnostic test signal to the first die and for receiving the results of the diagnostic testing from the second die. Also, where the interconnecting circuitry is provided in the probe, then two chains can be simultaneously tested such that the probe matingly engages the dice for transmitting the diagnostic test signal to the first die and the third die and receives the results of the diagnostic testing from the second die and the fourth die. In some embodiments, the probe matingly engages the dice for transmitting the diagnostic test signal to the first die and for receiving the results of diagnostic testing from the second die; the probe is then moved to matingly engage the dice for transmitting the diagnostic test signal to the third die and for receiving the results of diagnostic testing from the fourth die. In some embodiments the arrangement further comprises a means for qualifying the dice (such as 130) in response to the results of diagnostic testing from the dice.

Some embodiments contemplate a method for testing an integrated circuit (such as 200). The method includes providing the first die and the second die and transmitting the diagnostic test signal to the first die (such as 202). The first die then begins the diagnostic test sequence. Preferably, before the first die has completed the diagnostic test sequence, the diagnostic test signal is transmitted to the second die (such as 206). The diagnostic test sequence then begins in the second die (such as 208). The method then determines whether all the dice have received the diagnostic test signal (such as 210), and if yes, then determines whether all the diagnostic test sequences have been completed (such as 214). If so, then the method concludes by qualifying the dice (such as 216) on the basis of the testing results.

Some other embodiments contemplate an arrangement for testing an integrated circuit comprising a plurality of dice, and means for testing the plurality of dice by transmitting a diagnostic test signal for performing a diagnostic test on a first die of the plurality of dice and transmitting the diagnostic test signal to a second die of the plurality of dice before the diagnostic test on the first die is completed. The means for testing is characterized by transmitting the diagnostic test signal to a first die and receiving the results of the diagnostic test from a second die that is interconnected with the first die. The means for testing is further characterized by means for qualifying the first die and the second die based on results of the diagnostic test. For purposes of this description, the means for testing specifically excludes a device and associated methodology whereby a single die is tested, the test results are obtained, and then a transmitting means, such as a probe, is moved to another single die which is then tested alone.

It is to be understood that even though numerous characteristics and advantages of various embodiments of the present invention have been set forth in the foregoing description, together with the details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular elements may vary depending on the particular geometry supporting the dice or the test probes while maintaining substantially the same functionality without departing from the scope and spirit of the present invention. In addition, although the preferred embodiments described herein are directed to a probe device for IC technology, it will be appreciated by those skilled in the art that the teachings of the present invention can be applied to other systems without departing from the spirit and scope of the present invention.

It will be clear that the present invention is well adapted to attain the ends and advantages mentioned as well as those inherent therein. While presently preferred embodiments have been described for purposes of this disclosure, numerous changes may be made which readily suggest themselves to those skilled in the art and which are encompassed in the spirit of the invention disclosed and as defined in the appended claims.

What is claimed is:

1. A method for testing an integrated circuit comprising:
   processing a first die and a second die, each comprising diagnostic testing circuitry responsive to a diagnostic test signal;
   transmitting the diagnostic test signal to the first die; and
   subsequently transmitting the diagnostic test signal from the first die to the second die before diagnostic testing of the first die is completed.

2. The method of claim 1 comprising:
   processing a third die and a fourth die, each comprising diagnostic testing circuitry responsive to the diagnostic test signal;

transmitting the diagnostic test signal to the first die and the third die;

subsequently transmitting the diagnostic test signal to the second die and the fourth die while simultaneously performing the diagnostic testing of the first die and the third die.

3. The method of claim 1 wherein the subsequently transmitting step is characterized by interconnecting circuitry between the dice that is disposed with the dice in a wafer substrate.

4. The method of claim 2 wherein the simultaneously transmitting step is characterized by a probe operably matingly engaging the dice for transmitting the diagnostic test signal to the first die and the third die.

5. The method of claim 2 wherein the transmitting steps comprise:

matingly engaging the dice with a probe for transmitting the diagnostic test signal to the first die and for receiving results of diagnostic testing from the second different die;

moving the probe; and matingly engaging the dice with the probe for transmitting the diagnostic test signal to the third die and receiving the results of diagnostic testing from the fourth die.

6. The method of claim 4 wherein the subsequently transmitting step is characterized by interconnecting circuitry between the dice that is disposed in the probe.

7. The method of claim 1 comprising qualifying the dice in response to results of diagnostic testing from the dice.

8. The method of claim 1 comprising transmitting the results of diagnostic testing from the second die to the first die.

9. An arrangement for testing an integrated circuit comprising:

first and second dice, each comprising circuitry capable of diagnostic testing in response to a diagnostic test signal, the circuitry defining an input for receiving the diagnostic test signal and an output for transmitting results of the diagnostic testing for each of the dice;

interconnecting circuitry between the dice transmitting the diagnostic test signal transmitted to the first die to the second die before the diagnostic testing is completed in the first die; and turn around circuitry that transmits the results of the diagnostic testing from the second die to the first die, the first die comprising the input and the output.

10. The arrangement of claim 9 further comprising a third die interconnected between the first and second dice.

* * * * *